(12) United States Patent
Hao et al.

(10) Patent No.: US 12,181,920 B2
(45) Date of Patent: Dec. 31, 2024

(54) BACKPLANE, FRAME STRUCTURE AND DISPLAY DEVICE

(71) Applicants: K-Tronics (Suzhou) Technology Co., Ltd., Jiangsu (CN); BOE Technology Group Co., Ltd., Beijing (CN)

(72) Inventors: Guangning Hao, Beijing (CN); Xiaojin Li, Beijing (CN); Liangbo Wang, Beijing (CN)

(73) Assignees: K-TRONICS (SUZHOU) TECHNOLOGY CO., LTD., Jiangsu (CN); BOE TECHNOLOGY GROUP CO., LTD., Beijing (CN)

( * ) Notice: Subject to any disclaimer, the term of this patent is extended or adjusted under 35 U.S.C. 154(b) by 197 days.

(21) Appl. No.: 17/851,285

(22) Filed: Jun. 28, 2022

(65) Prior Publication Data
US 2022/0326733 A1 Oct. 13, 2022

Related U.S. Application Data

(63) Continuation-in-part of application No. 16/944,618, filed on Jul. 31, 2020, now Pat. No. 11,402,866.

(30) Foreign Application Priority Data

Sep. 26, 2019 (CN) .......................... 201910918374.4

(51) Int. Cl.
*G06F 1/16* (2006.01)
*H05K 5/02* (2006.01)

(52) U.S. Cl.
CPC .......... *G06F 1/1637* (2013.01); *H05K 5/0217* (2013.01)

(58) Field of Classification Search
CPC ...... G06F 1/1601; G06F 1/1626; G06F 1/181; G06F 1/1637; F16M 13/005; F16M 2200/02; G09F 9/00
See application file for complete search history.

(56) References Cited

U.S. PATENT DOCUMENTS 7,467,963 B2 * 12/2008 Chen ..................... H01R 27/00
 439/328
7,929,078 B2 * 4/2011 Kawada ............ G02F 1/133608
 349/70

(Continued)

FOREIGN PATENT DOCUMENTS

CN 206489344 U 9/2017
CN 207399673 U 5/2018

(Continued)

OTHER PUBLICATIONS

Office Action dated Jul. 14, 2023 issued in corresponding Chinese Application No. 201910918374.4.

(Continued)

*Primary Examiner* — Rockshana D Chowdhury
(74) *Attorney, Agent, or Firm* — Nath, Goldberg & Meyer; Joshua B. Goldberg (57) ABSTRACT

The present disclosure provides a backplane, a frame structure and a display device. The backplane provided in the present disclosure is secured to a middle frame in a display panel to form a frame structure of the display panel, the backplane including: a bottom plate and a skirt connected to edges of the bottom plate, wherein at least part of the skirt is provided with a clamping member for securing the backplane to the middle frame, the clamping member is provided with a breakable structure configured to break under an external force for disengaging the clamping member from the skirt so that the backplane is separated from the middle frame.

11 Claims, 4 Drawing Sheets

(56) References Cited

U.S. PATENT DOCUMENTS

| | | | | |
|---|---|---|---|---|
| 8,199,477 | B2* | 6/2012 | Mathew | G06F 1/1637 |
| | | | | 345/905 |
| 8,238,087 | B2* | 8/2012 | McClure | H05K 1/0281 |
| | | | | 292/196 |
| 8,284,343 | B2* | 10/2012 | Koike | G02F 1/133308 |
| | | | | 349/56 |
| 8,434,251 | B2* | 5/2013 | Lee | G06F 1/1601 |
| | | | | 40/780 |
| 9,122,099 | B2* | 9/2015 | Li | G02F 1/133608 |
| 9,482,812 | B2* | 11/2016 | Que | G02B 6/0088 |
| 9,733,675 | B2* | 8/2017 | Liao | G06F 1/1656 |
| 9,910,306 | B2* | 3/2018 | An | G02F 1/133308 |
| 10,331,170 | B2 | 6/2019 | Montevirgen et al. | |
| 10,627,855 | B2 | 4/2020 | Huang et al. | |
| 2008/0146293 | A1* | 6/2008 | Kim | H04M 1/0252 |
| | | | | 455/575.1 |
| 2009/0115738 | A1* | 5/2009 | Chueh | G06F 3/041 |
| | | | | 345/173 |
| 2009/0237874 | A1* | 9/2009 | Prest | H05K 5/0017 |
| | | | | 361/679.01 |
| 2009/0257189 | A1* | 10/2009 | Wang | H04M 1/0249 |
| | | | | 361/679.56 |
| 2011/0164370 | A1* | 7/2011 | McClure | H05K 1/0281 |
| | | | | 29/592.1 |
| 2012/0147610 | A1* | 6/2012 | Ransvi | F21S 4/28 |
| | | | | 362/382 |
| 2012/0162950 | A1* | 6/2012 | Liu | H05K 5/02 |
| | | | | 361/807 |
| 2012/0257138 | A1* | 10/2012 | Iwamoto | G06F 1/1656 |
| | | | | 445/66 |
| 2013/0057484 | A1* | 3/2013 | Chiu | G06F 1/1637 |
| | | | | 345/173 |
| 2013/0128179 | A1* | 5/2013 | Yu | G02F 1/133308 |
| | | | | 29/464 |
| 2014/0062274 | A1 | 3/2014 | Hirasawa | |
| 2016/0286670 | A1 | 9/2016 | Wang et al. | |
| 2017/0168345 | A1 | 6/2017 | Wu et al. | |
| 2018/0059467 | A1 | 3/2018 | Song et al. | |

FOREIGN PATENT DOCUMENTS

| | | |
|---|---|---|
| CN | 208351188 U | 1/2019 |
| CN | 208488914 U | 2/2019 |
| CN | 109712538 A | 5/2019 |
| CN | 109884816 A | 6/2019 |
| CN | 209281803 U | 8/2019 |
| CN | 209356802 U | 9/2019 |
| CN | 210200182 U | 3/2020 |

OTHER PUBLICATIONS

Non-Final Office Action dated Dec. 14, 2021 corresponding to U.S. Appl. No. 16/944,618.

Notice of Allowance dated Mar. 29, 2022 corresponding to U.S. Appl. No. 16/944,618.

\* cited by examiner

BACKPLANE, FRAME STRUCTURE AND DISPLAY DEVICE

TECHNICAL FIELD

The present disclosure relates to the field of display technologies, and particularly relates to a backplane, a frame structure and a display device.

BACKGROUND

Spliced frame structures are often adopted in various display devices nowadays. A spliced frame structure typically includes a backplane, a middle frame and a metal buckle via which the backplane and the middle frame are connected into a whole.

However, existing metal buckles are usually designed for easy mounting but not easy dismounting. As a result, the middle frame and the backplane connected into an integrated frame structure through an existing metal buckle are usually difficult to separate thereafter.

SUMMARY

The present disclosure provides a display substrate that, when the backplane needs to be separated from the middle frame, can separate a clamping member from a skirt of the backplane by applying an external force to a breakable structure of the clamping member so that the separation of the middle frame and the backplane is completed.

The technical solution adopted to solve the technical problem of the present disclosure is a backplane secured to a middle frame in a display panel to form a frame structure of the display panel. The backplane includes: a bottom plate and a skirt connected to edges of the bottom plate; wherein at least part of the skirt is provided with a clamping member for securing the backplane to the middle frame; and wherein the clamping member is provided with a breakable structure configured to break under an external force for disengaging the clamping member from the skirt so that the backplane is separated from the middle frame.

In the above backplane provided by the present disclosure, since the breakable structure is provided on the clamping member for connecting the middle frame to the backplane, when the backplane needs to be separated from the middle frame, the clamping member can be separated from the skirt of the backplane when an external force is applied to the breakable structure of the clamping member, thereby accomplishing the separation of the middle frame and the backplane.

Optionally, in the above backplane provided by the present disclosure, the skirt of the backplane includes a first side surface and a second side surface extending along a length direction thereof and arranged oppositely; the clamping member includes a first side part and a second side part arranged oppositely, and an upper part connected between the first side part and the second side part; the first side part is provided with a clamping tongue structure as the breakable structure, and the first side surface is provided with a groove; the second side part is provided with a clamping elastic sheet; and when the clamping member is clamped onto the skirt, the clamping tongue structure is engaged in the groove, and the clamping elastic sheet secures the backplane to the middle frame, and when the clamping tongue structure is broken from a root of the clamping tongue structure under the external force, the clamping tongue structure is released from the groove, so that the clamping member is disengaged from the skirt.

Optionally, in the above backplane provided by the present disclosure, the first side part is provided with a second hollowed-out portion; the clamping tongue structure is disposed in the second hollowed-out portion, with one end configured as the root closer to the bottom plate secured to a lower side of the second hollowed-out portion closer the bottom plate and the other end away from the bottom plate being movable, and the clamping tongue structure has the smallest cross-sectional dimension at the root.

Optionally, in the above backplane provided by the present disclosure, the clamping tongue structure is an isosceles triangle, and an apex angle of the isosceles triangle corresponds to the root of the clamping tongue structure.

Optionally, in the above backplane provided by the present disclosure, a tab is provided on a side of the first side part facing away from the first side surface, and the tab is configured to abut with a reinforcing rib of the middle frame, so as to restrict turn-over of the middle frame relative to the skirt of the backplane.

Optionally, in the above backplane provided by the present disclosure, the tab includes a plurality of tabs arranged symmetrically with each other.

Optionally, in the above backplane provided by the present disclosure, the second side part has a plurality of clamping elastic sheets, and a connection part disconnected from the plurality of clamping elastic sheets and located between two adjacent clamping elastic sheets; wherein the plurality of clamping elastic sheets and the connection part are connected to the upper part.

Optionally, in the above backplane provided by the present disclosure, an inner width of the clamping member is greater than a thickness of the skirt, and a difference between the inner width of the clamping member and the thickness of the skirt is greater than an engagement depth of the clamping tongue structure in the groove; and wherein the inner width of the clamping member is a distance between the first side part and the connection part in a direction perpendicular to the first side part.

Optionally, in the above backplane provided by the present disclosure, the connection part has a first hollowed-out portion; the first hollowed-out portion is provided with a buckle elastic sheet obliquely extending toward the first side part; and when the clamping member is clamped onto the skirt, the buckle elastic sheet is abutted against the second side surface of the skirt so that the clamping member is secured to the skirt.

Optionally, in the above backplane provided by the present disclosure, the material of the clamping member includes: spring steel.

Accordingly, the present disclosure further provides a frame structure including any one of the backplanes as described above, and a middle frame secured to the backplane.

Optionally, in the above frame structure provided by the present disclosure, the middle frame includes a side plate; the side plate includes a third side surface and a fourth side surface extending along a length thereof and arranged oppositely; the middle frame is sleeved outside the backplane, and the third side surface of the side plate is disposed opposite to the second side surface of the skirt; and the third side surface of the middle frame has a convex structure on which the clamping elastic sheet is clamped when the middle frame is secured to the backplane via the clamping member, so as to secure the relative position of the middle frame and the backplane.

Accordingly, the present disclosure further provides a display device including any one of the frame structures as described above.

DETAILED DESCRIPTION OF THE EMBODIMENTS

To make the objects, technical solutions and advantages of the present disclosure more clear, the present disclosure will be described in further detail with reference to the accompanying drawings, and it is apparent that the described embodiments are only some, but not all, embodiments of the present disclosure. All other embodiments obtained by the ordinarily skilled in the art based on the embodiments of the present disclosure without paying any creative effort shall be included in the protection scope of the present disclosure.

The shapes and sizes of the components in the drawings are not to scale, but are merely intended to facilitate understanding of the contents of the embodiments of the present disclosure.

Figure 1:
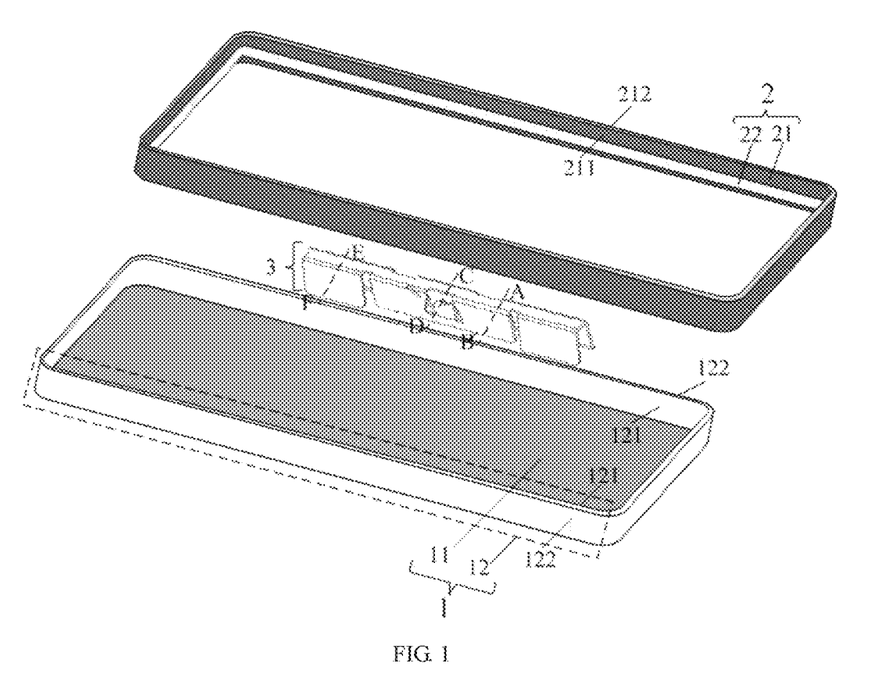
FIG. 1 is a schematic structural view of a frame structure formed by connecting an embodiment of a backplane according to the present disclosure to a middle frame.

As shown in FIG. 1, in an embodiment of the present disclosure, there is provided a backplane 1 which, when used in a display panel, may be secured to a middle frame 2 in the display panel to form a frame structure of the display panel.

Specifically, as shown in FIG. 1, the backplane 1 of the embodiment includes a bottom plate 11, and a skirt 12 connected to edges of the bottom plate 11. At least part of the skirt 12 is provided with a clamping member 3 for securing the backplane 1 to the middle frame 2 to form the frame structure. The clamping member 3 is provided with a breakable structure 35 configured to break under an external force for disengaging the clamping member 3 from the skirt 12 of the backplane 1 so that the backplane 1 is separated from the middle frame 2.

It should be noted that the skirt 12 of the backplane 1 is arranged at the edges of the bottom plate 11 of the backplane 1, and the skirt 12 extends upward in a direction away from the bottom plate 11. The bottom plate 11 may include a polygonal bottom plate, and the clamping member 3 is provided on the skirt 12 of at least one side of the bottom plate 11. For example, the bottom plate 11 may be a rectangular bottom plate having the skirt 12 on four sides, and the clamping member 3 is disposed on the skirt 12 of at least one side of the rectangular bottom plate, which may be specifically designed as needed and is not limited herein. The following description will be given by taking the example where the bottom plate 11 of the backplane 1 is rectangular, the edges of the rectangular bottom plate have the skirt 12 on four sides, and the clamping member 3 is disposed on the skirt 12 on one side.

In the backplane provided by the embodiment, since the breakable structure 35 is provided on the clamping member 3 for connecting the middle frame 2 to the backplane 1, when the backplane 1 needs to be separated from the middle frame 2, the clamping member 3 can be separated from the skirt 12 of the backplane 1 when an external force is applied to the breakable structure 35 of the clamping member 3 to break the breakable structure 35, thereby accomplishing the separation of the middle frame 2 and the backplane 1.

Optionally, as shown in FIG. 1, in the backplane provided by the embodiment, the skirt 12 of the backplane 1 includes a first side surface 121 and a second side surface 122 extending along a length direction of the skirt 12 and arranged oppositely.

Figure 2A:
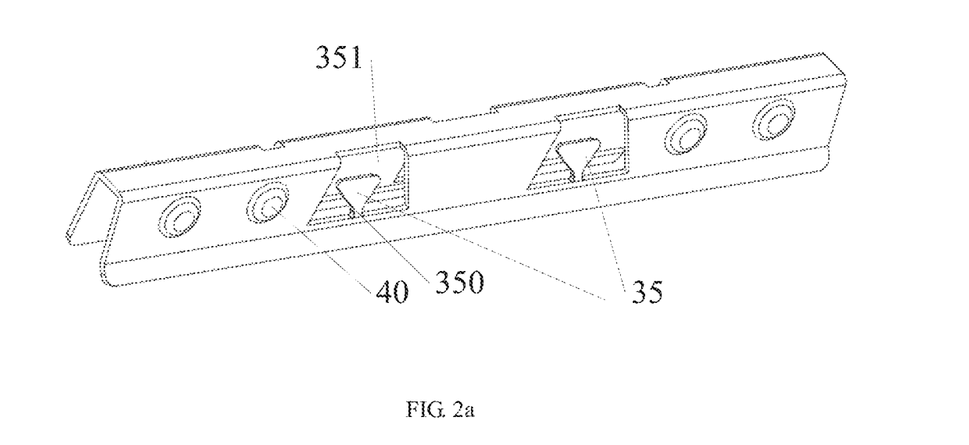
FIG. 2a is a schematic structural view of an embodiment of a clamping member in a backplane according to the present disclosure (a schematic view of a first side part of the clamping member)
Figure 2B:
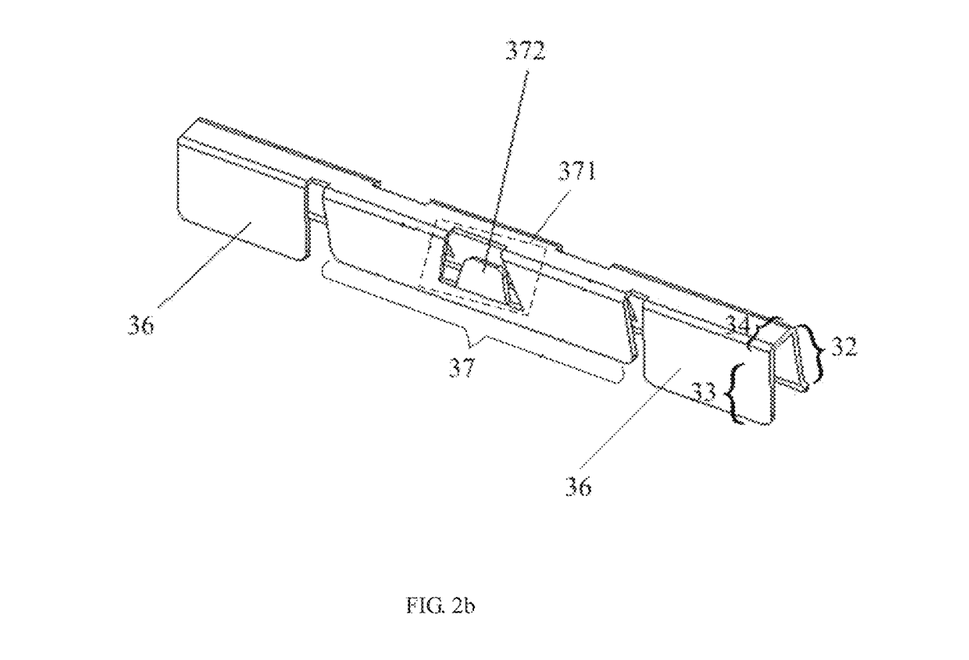
FIG. 2b is a schematic structural view of an embodiment of a clamping member in a backplane according to the present disclosure (a schematic view of a second side part of the clamping member)

Referring to FIGS. 1, 2a and 2b, FIGS. 2a and 2b are schematic structural views of the clamping member 3 in FIG. 1, and the clamping member 3 includes a first side part 32 and a second side part 33 arranged oppositely, and an upper part 34 of the clamping member 3 connected between the first side part 32 of the clamping member 3 and the second side part 33 of the clamping member 3. The first side part 32, the second side part 33 and the upper part 34 of the clamping member 3 form a generally U-shaped sectional structure to receive the skirt 12 of the backplane 1. When the clamping member 3 is clamped onto the skirt 12 of the backplane 1, the first side part 32 of the clamping member 3 contacts the first side surface 121 of the skirt 12, the second side part 33 of the clamping member 3 contacts the second side surface 122 of the skirt 12, the upper part 34 of the clamping member 3 is connected between the first side part 32 of the clamping member 3 and the second side part 33 of the clamping member 3, and the first side part 32, the second side part 33 and the upper part 34 of the clamping member 3 form a clamping structure that clamps the skirt 12 of the backplane 1 therein.

Figure 3:
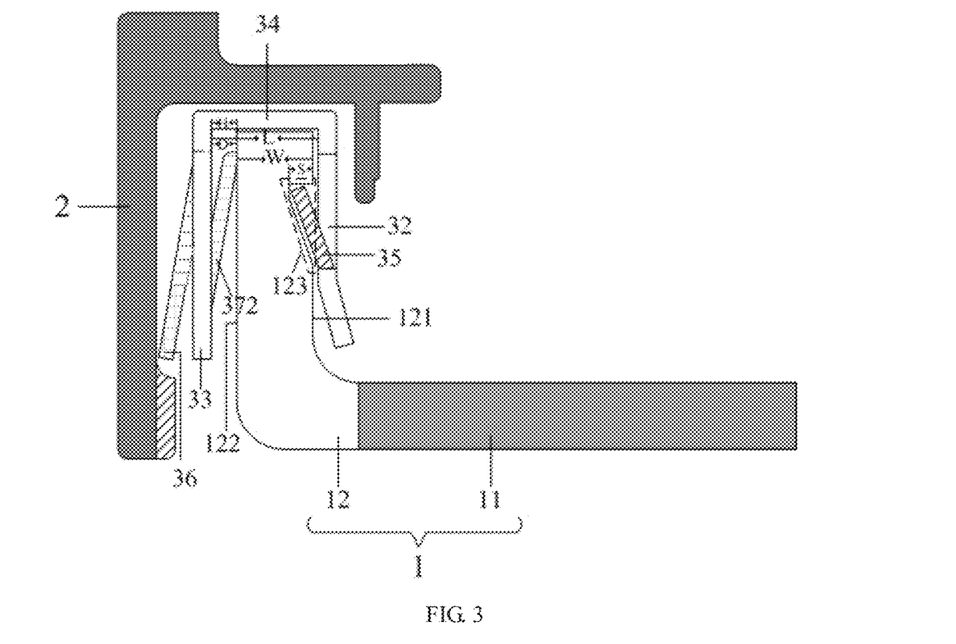
FIG. 3 is a sectional side view taken along a direction A-B after the backplane 1, the middle frame 2 and the clamping member 3 in FIG. 1 are secured together.

Further, as shown in FIGS. 2a and 3, FIG. 3 is a sectional side view taken along a direction A-B after the backplane 1, the middle frame 2 and the clamping member 3 in FIG. 1 are secured together. The first side part 32 of the clamping member 3 is provided with a clamping tongue structure 35 as the breakable structure, and the first side surface 121 of the skirt 12 is provided with a groove 123. When the clamping member 3 is clamped onto the skirt 12 of the backplane 1, the first side part 32 of the clamping member 3 contacts the first side surface 121 of the skirt 12, and the clamping tongue structure 32 on the clamping member 3 may be clamped into the groove 123 on the first side surface 121 of the skirt 12, i.e., the clamping tongue structure 32 may be engaged with the groove 123 to secure the clamping member 3 on the skirt 12, so as to prevent the clamping member 3 from falling off from the skirt 12. When the clamping tongue structure 35 is broken from a root 350 of the clamping tongue structure under the external force, the clamping tongue structure is released from the groove 123, so that the clamping member is disengaged from the skirt. As shown in FIG. 3, for example, the clamping tongue structure 32 extends obliquely from the first side part to the second side part and into the U-shaped sectional structure.

Figure 4:
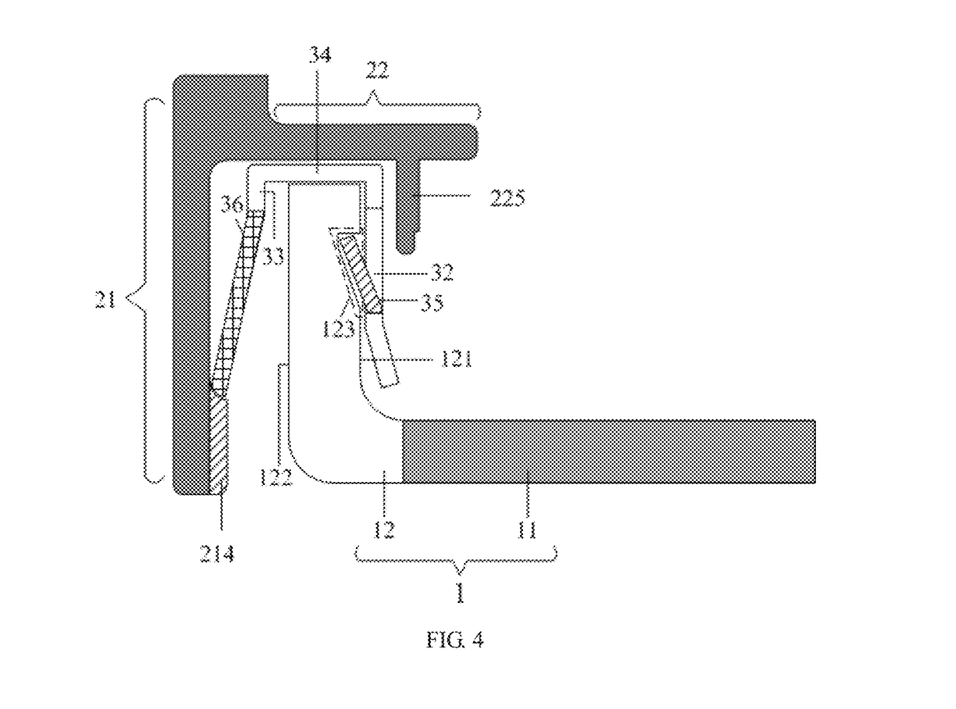
FIG. 4 is a sectional side view taken along a direction E-F after the backplane 1, the middle frame 2 and the clamping member 3 in FIG. 1 are secured together.

Further, as shown in FIG. 2b, the second side part 32 of the clamping member 3 is provided with a clamping elastic sheet 36 for securing the backplane 1 to the middle frame 2. As shown in FIG. 4, for example, the clamping elastic sheet 36 extends obliquely from the second side part in a direction away from the first side part.

Specifically, as shown in FIGS. 2b and 4, FIG. 4 is a sectional side view taken along a direction E-F after the backplane 1, the middle frame 2 and the clamping member 3 in FIG. 1 are secured together. Referring to FIG. 2b, the second side part 32 of the clamping member 3 may be provided with a plurality of clamping elastic sheets 36 (e.g., two clamping elastic sheets 36), and a connection part disconnected from the plurality of clamping elastic sheets 36 and located between two adjacent clamping elastic sheets 36. If the second side part 32 of the clamping member 3 is provided with two clamping elastic sheets 36, then the second side part 32 of the clamping member 3 further has a connection part 37 located between and disconnected from the two clamping elastic sheets 36. The disconnected arrangement means that two adjacent clamping elastic sheets 36 on the second side part 32 of the clamping member 3 are spaced apart from each other, but the clamping elastic sheets 36 and the connection part 37 on the second side part 32 of the clamping member 3 are both connected to the upper part 34 of the clamping member 3.

Optionally, as shown in FIG. 3, in the backplane 1 of this embodiment, an inner width L of the clamping member 3 is greater than a thickness W of the skirt 12 of the backplane 1, and the difference D between the inner width L of the clamping member 3 and the thickness W of the skirt 12 is greater than an engagement depth S of the clamping tongue structure 35 of the first side part 32 of the clamping member 3 into the groove 123 in the first side surface 121 of the skirt 12, that is, the difference D between the inner width L of the clamping member 3 and the thickness W of the skirt 12 satisfies:

$$D=L-W>S$$

where the inner width L of the clamping member 3 is a distance between the first side part 32 of the clamping member 3 and the connection part 37 of the clamping member 3 in a direction perpendicular to the first side part 32.

Figure 5:
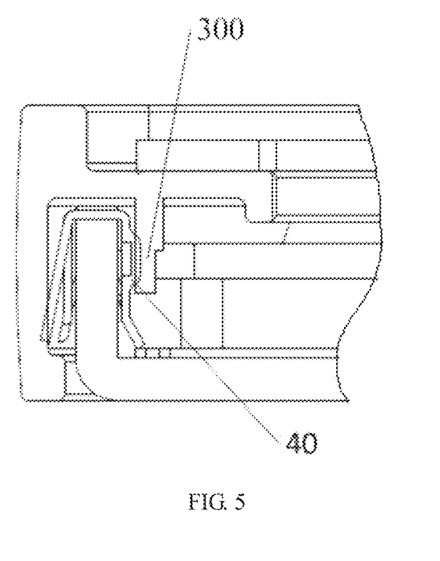
FIG. 5 is a sectional side view taken along a direction E-F to show how a tab abuts with a reinforcing rib of the middle frame.

Referring to FIGS. 3 and 5, after the clamping member 3 is clamped onto the skirt 12 of the backplane 1, i.e., after the clamping tongue structure 35 of the first side part 32 of the clamping member 3 is engaged with the groove 123 in the first side surface 121 of the skirt 12, if the difference D is greater than the engagement depth S, a distance H (H≈D) between the second side part 33 of the clamping member 3 and the second side surface 122 of the skirt 12 is greater than the engagement depth S of the clamping tongue structure 35 into the groove 123. Optionally, as shown in FIG. 3, FIG. 3 is a sectional side view taken along a direction C-D after the backplane 1, the middle frame 2 and the clamping member 3 in FIG. 1 are secured together. In the backplane 1 of this embodiment, the connection part 37 of the clamping member 3 has a first hollowed-out portion 371, and the first hollowed-out portion 371 is provided with a buckle elastic sheet 372 obliquely extending toward the first side part 32. When the clamping member 3 is clamped onto the skirt 12 of the backplane 1, the buckle elastic sheet 372 may be abutted against the second side surface 122 of the skirt 12 so that the clamping member 3 is secured to the skirt 12 of the backplane 1.

Specifically, as shown in FIG. 2b, the buckle elastic sheet 372 may be, for example, an elastic sheet inclined in a direction toward the second side surface 122 of the skirt 12, and one end of the buckle elastic sheet 372 closer to the bottom plate is secured to a lower side of the first hollowed-out portion 371 closer to the bottom plate 11 of the backplane 1, while the other end of the buckle elastic sheet 372 away from the bottom plate 11 is movable. Further, as shown in FIG. 6, a distance N between the end of the clamping tongue structure 35 away from the bottom plate 11 and the end of the buckle elastic sheet 372 away from the bottom plate 11 is smaller than a thickness W of the skirt 12 of the backplane 1 so that when the clamping member 3 is clamped onto the skirt 12 of the backplane 1, the buckle elastic sheet 372 may be abutted against the second side surface 122 of the skirt 12 to secure the clamping member 3 to the skirt 12 and prevent the clamping member 3 from fall off from the skirt 12.

Optionally, the first hollowed-out portion 371 may have various shapes, as long as the buckle elastic sheet 372 can be disposed in the first hollowed-out portion 371, which is not limited herein. A length of the first hollowed-out portion 371 in the direction perpendicular to the bottom plate 11 may be greater than a length of the buckle elastic sheet 372 in the direction perpendicular to the bottom plate 11, so as to facilitate movement of the movable end of the buckle elastic sheet 372.

Optionally, the buckle elastic sheet 372 may include elastic sheets of various shapes, such as rectangular, trapezoidal and triangular elastic sheets. If the buckle elastic sheet is rectangular or trapezoidal, a greater force may be applied to the second side surface 122 of the skirt 12 when the buckle elastic sheet 372 abuts against the second side surface 122 of the skirt 12, thereby enhancing the securing of the clamping member 3 to the skirt 12. If the buckle elastic sheet 372 is triangular, the second side part 33 of the clamping member 3 can be more easily attached to the second side surface 122 of the skirt 12, thereby achieving easier separation of the clamping member 3 from the skirt 12. Apparently, the buckle elastic sheet 372 may also have other shapes, and may be specifically designed according to actual needs, which is not limited herein.

Optionally, as shown in FIG. 2a, in the backplane 1 of this embodiment, the first side part 32 of the clamping member 3 is provided with a second hollowed-out portion 351. The clamping tongue structure 35 is disposed in the second hollowed-out portion 351, with one end as the root 350 closer to the bottom plate 11 secured to a lower side of the second hollowed-out portion 351 closer to the bottom plate 11 and the other end away from the bottom plate 11 being movable, and the clamping tongue structure has the smallest cross-sectional dimension at the root. The clamping tongue structure 35 may be, for example, an elastic sheet inclined in a direction toward the first side surface 121 of the skirt 12, the groove 123 in the first side surface 121 of the skirt 12 is positioned corresponding to the clamping tongue structure 35, and a bottom of the groove 123 may be an inclined surface inclined toward the inside of the skirt 12 with an inclination degree corresponding to that of the clamping tongue structure 35. Specifically, the depth of the groove 123 in the first side surface 121 gradually increases along a direction in which the first side surface 121 of the skirt 12 points away from the bottom plate 11. The higher the inclination degree of the clamping tongue structure 35, the greater the maximum depth of the corresponding groove 123, and thus the greater the engagement amount between the clamping tongue structure 35 and the groove 123. The greater the engagement depth between the clamping tongue structure 35 and the groove 123 is, the less possible the clamping member 3 falls off from the skirt 12.

Optionally, the clamping tongue structure 35 may include various shapes, such as rectangular, trapezoidal and triangular. If the clamping tongue structure 35 is rectangular or trapezoidal, the movable end of the clamping tongue structure 35 contacts the groove 123 by a larger area so that the clamping tongue structure 35 is more firmly secured to the groove 123. If the clamping tongue structure 35 is triangular, when the clamping tongue structure 35 needs to be engaged into the groove 123, the clamping tongue structure 35 is easier to be aligned with the groove 123. Apparently, the clamping tongue structure 35 may also have other shapes, and may be specifically designed according to actual needs, which is not limited herein.

Optionally, the clamping tongue structure 35 is an isosceles triangle, and an apex angle of the isosceles triangle corresponds to the root 350 of the clamping tongue structure. The root 350 of clamping tongue structure 35 can be broken under an external force for disengaging the clamping member from the skirt, so that the backplane is separated from the middle frame.

Optionally, the second hollowed-out portion 351 may have various shapes, as long as the clamping tongue structure 35 can be disposed in the second hollowed-out portion 351, which is not limited herein. A length of the second hollowed-out portion 351 in the direction perpendicular to the bottom plate 11 may be greater than a length of the clamping tongue structure 351 in the direction perpendicular to the bottom plate 11, so as to facilitate movement of the movable end of the clamping tongue structure 351.

Optionally, as shown in FIG. 2a, in the backplane 1 of this embodiment, a plurality of second hollowed-out portions 351 and a plurality of clamping tongue structures 35 may be disposed on the first side part 32 of the clamping member 3. For example, there may be two second hollowed-out portions 351 symmetrically disposed about a midline of the clamping member 3 in a direction parallel to the bottom plate 11. Each of the second hollowed-out portions 351 is provided with a clamping tongue structure 35, and the first side surface 121 of the corresponding skirt 12 is also provided with two grooves 123 so that the clamping tongue structures 35 may correspond to and be engaged in the grooves 123 one by one, thereby securing the clamping member 3 and the skirt 12 more firmly.

Optional, a tab 40 is provided on a side of the first side part facing away from the first side surface, and the tab 40 is configured to abut with a reinforcing rib 300 of the middle frame, so as to restrict turn-over of the middle frame relative to the skirt of the backplane. After the engagement, the tab 40 abuts against the position of the reinforcing rib 300 of the middle frame, so that the middle frame can maintain a vertical state after being assembled, and will not be turned over due to the engagement of the clamping elastic sheet.

Optionally, the tab 40 includes a plurality of tabs arranged symmetrically with each other. As shown in FIG. 2a, the tab 40 includes four tabs arranged symmetrically with each other, so as to ensures a more stable holding of the middle frame.

Optionally, in the backplane 1 of this embodiment, the clamping member 3 may be made of various materials, such as spring steel, but of course, other materials may also be used, which is not limited herein.

Accordingly, as shown FIG. 1, in an embodiment of the present application, there is further provided a frame structure including the backplane 1 as described above, and a middle frame 2 secured to the backplane 1.

Optionally, as shown in FIGS. 1, 2b and 4, in the frame structure of this embodiment, the middle frame 2 secured to the backplane 1 includes a side plate 21. The side plate 21 includes a third side surface 211 and a fourth side surface 212 extending along a length of the side plate and arranged oppositely. The middle frame 2 is sleeved outside the backplane 1, and the third side surface 211 of the side plate 21 of the middle frame 2 is disposed opposite to the second side surface 122 of the skirt 12 of the backplane 1.

Specifically, as shown in FIGS. 1 and 4, the third side surface 211 of the side plate 21 of the middle frame 2 has a convex structure 214. The number of the convex structures 214 corresponds to the number of the clamping elastic sheets 36 on the first side part 32 of the clamping member 3. The clamping elastic sheets 36 may be elastic sheets inclined toward a direction away from the second side surface 122 of the skirt 12. When the middle frame 2 is secured to the backplane 1 via the clamping member 3, the clamping elastic sheets 36 are clamped on the convex structures 214 to secure the relative position of the middle frame 2 and the backplane 1.

Optionally, referring to FIGS. 1 and 4, in the frame structure of this embodiment, the middle frame 2 may further include an upper plate 22 disposed on the third side surface 211 of the side plate 21. The upper plate 22 is located at an edge of the bottom plate 11 of the backplane 1 and on the skirt 12 of the backplane 1, so as to block the skirt 12 of the backplane 1 and prevent the backplane 1 from falling out of the middle frame 2.

Optionally, referring to FIG. 4, in the frame structure of this embodiment, a light shielding part 225 may be further connected on a side of the upper plate 22 of the middle frame 2 away from the side plate 21, and disposed opposite to the first side part 32 of the clamping member 3. When the frame structure provided in this embodiment is applied to a display device, a light bar and a light guide plate are further provided on the bottom plate 11 of the backplane 1. The light bar and the light guide plate are located at a side of the light shielding part 225 of the middle frame 2 away from the first side part 32 of the clamping member 3, and the light shielding part 225 may block light overflowing sideward from the light bar or the light guide plate to prevent light leak therefrom.

It should be noted that the middle frame 2 may have various shapes, and the shape of the middle frame 2 corresponds to that of the bottom plate of the backplane. For example, if the bottom plate 11 of the backplane 1 is rectangular, the middle frame 2 is also rectangular, and the middle frame 2 may sleeve the backplane 1 in the middle frame 2, which may be specifically designed as needed and is not limited herein. The above description is made by taking an example in which the bottom plate of the backplane 1 is rectangular and the middle frame 2 is also rectangular corresponding to the bottom plate 11.

Accordingly, in an embodiment of the present application, there is further provided a display device including the frame structure as described above. The display device may be: a mobile phone, a tablet, a television, a monitor, a laptop, a digital album, a navigator or any other product or component having a display function. Other essential components of the display device are regarded as present by those skilled in the art, which are not described herein and should not be construed as limiting the present disclosure.

In summary, in the backplane provided by the present disclosure, since the dismounting structure 31 is provided on the clamping member 3 for connecting the middle frame 2 to the backplane 1, when the backplane 1 needs to be separated from the middle frame 2, the clamping member 3 can be separated from the skirt of the backplane 1 when an external force is applied to the dismounting structure 31 of the clamping member 3, thereby accomplishing the separation of the middle frame 2 and the backplane 1.

It will be appreciated that the above embodiments are merely exemplary embodiments for the purpose of illustrating the principle of the disclosure, and the disclosure is not limited thereto. Various modifications and improvements can be made by a person having ordinary skill in the art without departing from the spirit and essence of the disclosure. Accordingly, all of the modifications and improvements also fall into the protection scope of the disclosure.

What is claimed is:

1. A backplane secured to a middle frame in a display panel to form a frame structure of the display panel, the backplane comprising: a bottom plate and a skirt connected to edges of the bottom plate; wherein at least part of the skirt is provided with a clamping member for securing the backplane to the middle frame; and wherein the clamping member is provided with a breakable structure configured to break under an external force for disengaging the clamping member from the skirt so that the backplane is separated from the middle frame,
    wherein the skirt of the backplane comprises a first side surface and a second side surface extending along a length direction thereof and arranged oppositely;
    the clamping member comprises a first side part and a second side part arranged oppositely, and an upper part connected between the first side part and the second side part;
    the first side part is provided with a clamping tongue structure as the breakable structure, and the first side surface is provided with a groove;
    the second side part is provided with a clamping elastic sheet; and
    when the clamping member is clamped onto the skirt, the clamping tongue structure is engaged in the groove, and the clamping elastic sheet secures the backplane to the middle frame, and when the clamping tongue structure is broken from a root of the clamping tongue structure under the external force, the clamping tongue structure is released from the groove, so that the clamping member is disengaged from the skirt,
    wherein the first side part is provided with a second hollowed-out portion;
    the clamping tongue structure is disposed in the second hollowed-out portion, with one end configured as the root closer to the bottom plate secured to a lower side of the second hollowed-out portion closer the bottom plate and the other end away from the bottom plate being movable, and
    the clamping tongue structure has the smallest cross-sectional dimension at the root.

2. The backplane according to claim 1, wherein the clamping tongue structure is an isosceles triangle, and an apex angle of the isosceles triangle corresponds to the root of the clamping tongue structure.

3. The backplane according to claim 1, wherein a tab is provided on a side of the first side part facing away from the first side surface, and the tab is configured to abut with a reinforcing rib of the middle frame, so as to restrict turn-over of the middle frame relative to the skirt of the backplane.

4. The backplane according to claim 3, wherein the tab comprises a plurality of tabs arranged symmetrically with each other.

5. The backplane according to claim 1, wherein the second side part has a plurality of clamping elastic sheets, and a connection part disconnected from the plurality of clamping elastic sheets and located between two adjacent clamping elastic sheets; wherein the plurality of clamping elastic sheets and the connection part are connected to the upper part.

6. The backplane according to claim 1, wherein an inner width of the clamping member is greater than a thickness of the skirt, and a difference between the inner width of the clamping member and the thickness of the skirt is greater than an engagement depth of the clamping tongue structure in the groove; and
    wherein the inner width of the clamping member is a distance between the first side part and the connection part in a direction perpendicular to the first side part.

7. The backplane according to claim 1, wherein the connection part has a first hollowed-out portion; the first hollowed-out portion is provided with a buckle elastic sheet obliquely extending toward the first side part; and when the clamping member is clamped onto the skirt, the buckle elastic sheet is abutted against the second side surface of the skirt so that the clamping member is secured to the skirt.

8. The backplane according to claim 1, wherein the material of the clamping member comprises: spring steel.

9. A frame structure comprising the backplane according to claim 1, and a middle frame secured to the backplane.

10. The frame structure according to claim 9, wherein the middle frame comprises a side plate;
    the side plate comprises a third side surface and a fourth side surface extending along a length thereof and arranged oppositely;
    the middle frame is sleeved outside the backplane, and the third side surface of the side plate is disposed opposite to the second side surface of the skirt; and
    the third side surface of the middle frame has a convex structure on which the clamping elastic sheet is clamped when the middle frame is secured to the backplane via the clamping member, so as to secure the relative position of the middle frame and the backplane.

11. A display device comprising the frame structure according to claim 9.

* * * * *